United States Patent [19]

Bost et al.

[11] Patent Number: 5,289,035
[45] Date of Patent: Feb. 22, 1994

[54] TRI-LAYER TITANIUM COATING FOR AN ALUMINUM LAYER OF A SEMICONDUCTOR DEVICE

[75] Inventors: Melton C. Bost, Hillsboro; Simon Yang, Portland, both of Oreg.; Yeochung Yen, San Jose, Calif.; Jim Baldo, Beaverton; Barbara Greenebaum, Portland, both of Oreg.

[73] Assignee: Intel Corporation, Santa Clara, Calif.

[21] Appl. No.: 914,755

[22] Filed: Jul. 15, 1992

Related U.S. Application Data

[60] Division of Ser. No. 776,804, Oct. 15, 1991, which is a continuation-in-part of Ser. No. 635,685, Dec. 27, 1990.

[51] Int. Cl.$^5$ .................. H01L 23/48; H01L 29/46; H01L 29/54; H01L 29/62
[52] U.S. Cl. .................. 257/750; 257/751; 257/763; 257/913
[58] Field of Search .............. 357/67, 71; 257/431, 257/436, 437, 913, 750, 751, 763

[56] References Cited

U.S. PATENT DOCUMENTS

| | | | |
|---|---|---|---|
| 4,782,380 | 11/1988 | Shankar et al. | 357/71 |
| 4,804,636 | 2/1989 | Grover, III et al. | 437/52 |
| 5,101,260 | 3/1992 | Nath et al. | 357/67 |
| 5,124,780 | 6/1992 | Sandhu et al. | 357/67 |

FOREIGN PATENT DOCUMENTS

| | | | |
|---|---|---|---|
| 61-24435 | 10/1986 | Japan | 437/192 |
| 1-312852 | 12/1989 | Japan | 437/192 |

*Primary Examiner*—Jerome Jackson
*Assistant Examiner*—T. M. Arroyo
*Attorney, Agent, or Firm*—Blakely, Sokoloff, Taylor & Zafman

[57] ABSTRACT

A tri-layer titanium coating for an aluminum layer of a semiconductor device. An aluminum layer used for interconnecting individual devices of an integrated circuit is formed on a semiconductor material. A first titanium nitride layer is deposited on the aluminum layer. A titanium layer is deposited on the first titanium nitride layer. A second titanium nitride layer is then deposited on the titanium layer. The tri-layer titanium coating prevents the formation of $Al_2O_3$ and $AlF_3$ during the etching of a via hole in an intermetal dielectric layer deposited above the second titanium nitride layer.

3 Claims, 3 Drawing Sheets

TRI-LAYER TITANIUM COATING FOR AN ALUMINUM LAYER OF A SEMICONDUCTOR DEVICE

This is a divisional of application Ser. No. 07/776,804, filed Oct. 15, 1991, which is a continuation-in-part of application Ser. No. 07/635,685, filed Dec. 27, 1990.

BACKGROUND OF THE INVENTION

1. Field of the Invention

This invention relates to the field of semiconductor circuits and more specifically, to the composition of metal layers used in the interconnection of various devices in an integrated circuit.

2. Prior Art

Large scale integrated semiconductor circuits have multiple layers of conducting films interconnecting the various devices located on a semiconductor substrate. Modern devices typically have at least three metal layers; the first level of metalization (metal 1) provides for local interconnects while the latter metalization layers (metal 2 or metal 3, etc.) provide for longer interconnects, (i.e. across the entire chip). The conducting layers are normally separated by intermetal dielectric layers such as $SiO_2$ which act to isolate the potential of the conducting layers. Sometimes it is desired to interconnect the lines of different layers. When this is the case, a hole is etched through the intermetal dielectric so that when the upper metal layer (metal 2 or 3 or 4) is deposited it can form a contact with the lower level metal (metal 1 or 2 or 3) at the desired location. Such holes formed in dielectric layers are commonly referred to as via holes. Processes for etching via holes are well-known in the art.

A typical prior art method of forming an intermetal via hole is shown in FIG. 1. A thin single layer of aluminum or an aluminum alloy 11 is typically used as the conducting material (metal 1) to interconnect the device structures formed on a silicon substrate. An intermetal dielectric 13 is used to isolate the single aluminum layer 11 from a later formed conducting layer (metal 2). When it is desired to interconnect the two metal layers (metal 1 and metal 2) a via hole 19 is etched through the intermetal dielectric layer 13 to the aluminum layer 11. A photoresist layer 17 is masked, exposed and developed with well know lithography processes to form a mask which defines the area where the via is to be etched. The intermetal dielectric layer 13 is etched with commonly known etching techniques such as wet etching plasma etching or reactive ion etching. A wide variety of gas mixtures or chemicals can be employed as the active ingredient for the etch. Once the inner dielectric layer has been completely etched through, the underlying aluminum layer is exposed. The aluminum layer can react with fluorine atoms to form $AlF_3$. When the semiconductor device is removed from the reaction chamber the aluminum layer readily reacts with oxygen in the atmosphere to form $Al_2O_3$. $Al_2O_3$ and $AlF_3$ both form along the aluminum surface 20 in the via hole. $Al_2O_3$ and $AlF_3$ are both insulating materials and are both very difficult to remove.

After removing the photoresist layer 17, an outer layer of conducting film (metal 2) is formed on the dielectric layer and on the underlying aluminum layer in the via hole. The conducting film, however, actually forms on top of the undesired $Al_2O_3$ and $AlF_3$, which significantly increases the contact resistance of the device. Such an increase in contact resistance degrades the integrated circuit's performance.

What is desired, therefore, is a novel coating for an aluminum layer which will prevent the formation of $Al_2O_3$ and $AlF_3$ during the etching of a via hole.

SUMMARY OF THE INVENTION

The present invention provides a novel tri-layer titanium coating for an aluminum layer of a semiconductor device. The tri-layer titanium coating is comprised of a first titanium nitride layer deposited on the aluminum layer. A titanium layer is then deposited on the first titanium nitride layer. A second titanium nitride layer is next deposited on the titanium layer. The novel tri-layer titanium coating for aluminum allows the etching of a via hole in an intermetal dielectric layer without the formation of $Al_2O_3$ or $AlF_3$. The tri-layer coating also provides an anti-reflective coating for the aluminum layer during the lithography process of an aluminum patterning step. The tri-layer coating is also helpful in preventing void formation in aluminum layers.

DESCRIPTION OF THE PREFERRED EMBODIMENT

The present invention describes a novel tri-layer coating for an aluminum layer used in interconnecting the various devices of an integrated circuit. In the following description numerous specific details are set forth such as material thicknesses and plasma compositions, etc., in order to provide a more thorough understanding of the present invention. It will be obvious, however, to one skilled in the art that the present invention may be practiced without these specific details. In other instances, well-known processes have not been described in detail in order to not unnecessarily obscure the present invention.

Figure 2:
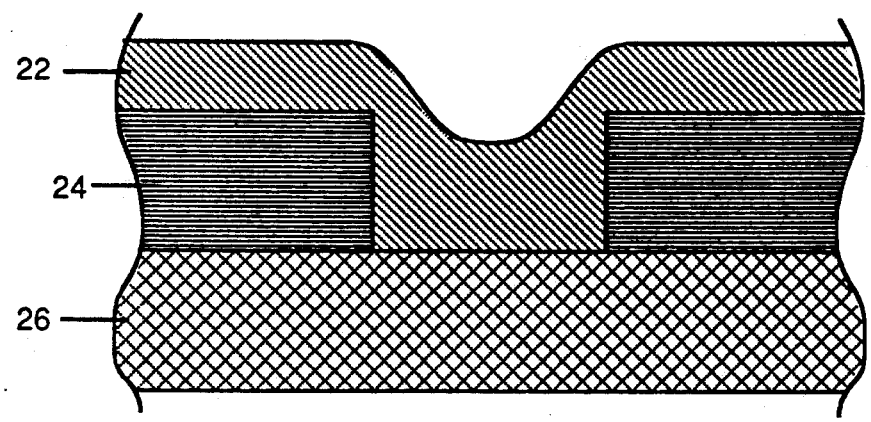
FIG. 2 is a cross-sectional view showing a formation of an aluminum layer (metal 1) over a semiconductor material and a dielectric material.

Referring to FIG. 2 of the present invention, a thin film of aluminum or aluminum alloy 22 (metal 1) is deposited to form the metallic interconnections for the various devices formed on a semiconductor material in an integrated circuit. The aluminum film 22 is deposited on both an insulating dielectric (polysilicon/metal 1 dielectric) layer 24 such as a high-temperature CVD-oxide and on a doped silicon substrate 26. Such deposition to form aluminum contacts is well-known in the art. In the presently preferred embodiment of the present invention, between 4,000-10,000 Å thick layer of aluminum with 0.5% copper is deposited by sputtering from an aluminum target.

Figure 3:
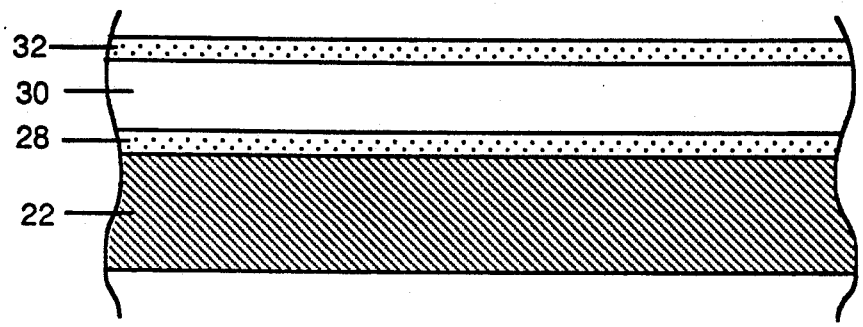
FIG. 3 is a cross-sectional view illustrating the formation of a tri-layer titanium coating on the aluminum layer.

Next, referring to FIG. 3, a novel tri-layer titanium coating is formed on the aluminum layer 22. A first 450 Å thick TiN layer 28 is formed on the aluminum layer 22, a layer thick enough to ensure no Ti-Al interaction. The first TiN layer is formed by sputtering titanium from a titanium target in a nitrogen atmosphere. A 1000 Å titanium layer 30 is next formed on the first TiN layer 28. The titanium layer 30 is thick enough to act as an etch stop. The titanium layer 30 is formed by sputtering titanium from a titanium target. A second TiN layer 32 of 450 Å is then formed on the titanium layer 30 by sputtering from a titanium target in a nitrogen atmosphere. The second TiN layer 32 has a thickness optimized to minimize optical reflection at alignment. In the presently preferred embodiment, the tri-layer titanium coating and aluminum layer are formed in three different chambers of a single sputter reactor. The aluminum layer 22 and the tri-layer titanium coating together form metal 1. Metal 1 is a multilayer film because it encompasses four distinct metal layers.

The tri-layer coating for the aluminum film provides several benefits in the manufacturing of integrated circuits. First, it provides an anti-reflective coating (ARC) for the aluminum layer in the lithographic processing of photoresist during subsequent aluminum patterning steps. ARCs reduce the standing wave effects caused by reflection of radiation off reflective materials like the aluminum layer 22. Secondly, the tri-layer coating serves as an electrical shunt for metal voids which can form in the aluminum lines due to electromigration. Additionally, and most importantly, the tri-layer titanium coating covers the aluminum layer 22 and prevents it from reacting with oxygen and/or fluorine atoms and forming $Al_2O_3$ and $AlF_3$ during a subsequent via hole etch.

Each layer of the novel tri-layer coating provides a distinct benefit and function. The second TiN layer 32 acts as the ARC for the aluminum layer 22. The Ti layer 30 provides shunts to cross voids which sometimes form in aluminum layer 22 due to electromigration. The first TiN layer 28 provides a transition layer between the Ti layer 30 and the aluminum layer 22. The first TiN layer 28 prevents the diffusion of the Ti layer 30 into the aluminum layer 22 and thus the formation of Ti/Al intermetallic. Such interaction can create aluminum voids, especially in wide area aluminum lines.

Figure 4:
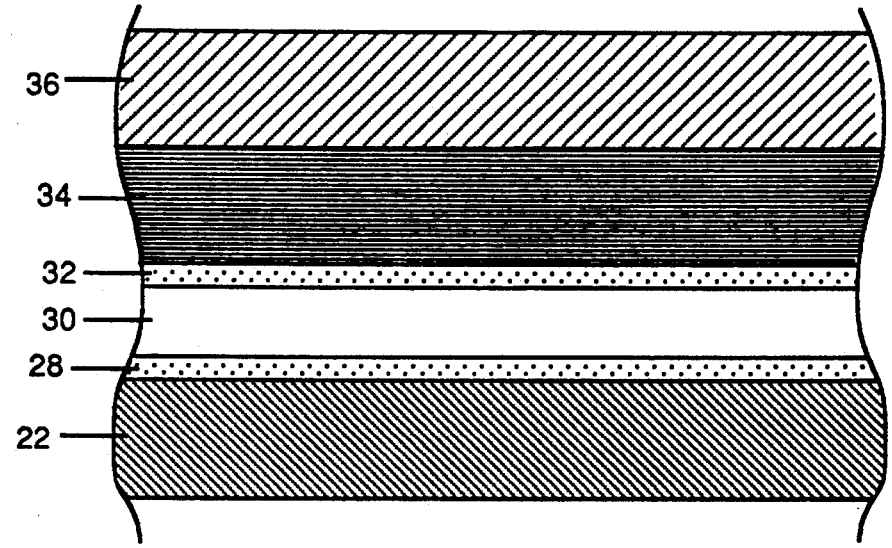
FIG. 4 is a cross-sectional view illustrating the formation of an intermetal dielectric layer on the tri-layer coating and the formation of a photoresist layer over the intermetal dielectric layer.

Referring to FIG. 4, an intermetal dielectric layer 34 is grown over the tri-layer titanium coating. The intermetal dielectric layer 34 provides electrical isolation between the formed aluminum layer 22 and a subsequently formed conducting layer (metal 2). In the presently preferred embodiment, the approximately one $\mu m$ intermetal dielectric layer 34 is $SiO_2$ formed by plasma chemical vapor deposition (CVD). A positive photoresist layer 36 is then deposited on the intermetal dielectric layer 34 by typical methods know in the art.

Figure 5:
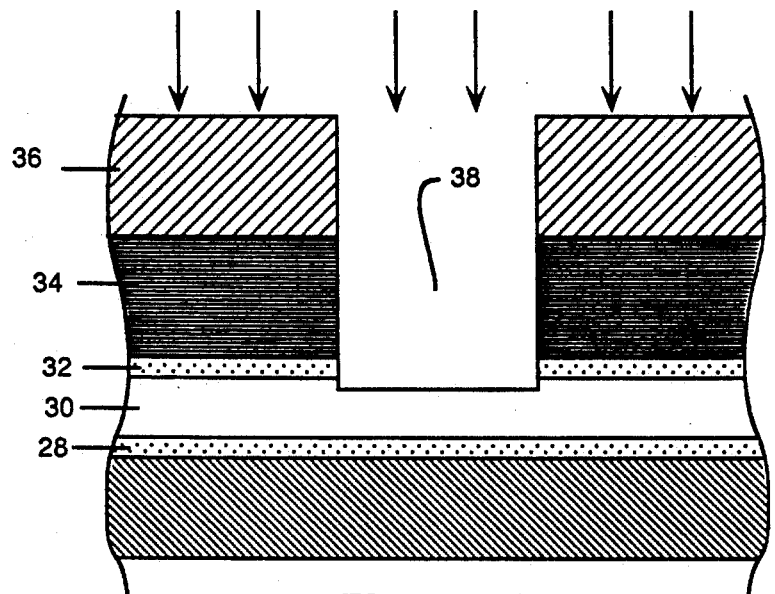
FIG. 5 is a cross-sectional view illustrating the patterning of the photoresist layer and the subsequent etching of the intermetal dielectric layer without the formation of $Al_2O_3$ and $AlF_3$.

Referring to FIG. 5, the photoresist layer 36, is masked, exposed, and developed to define the location where a via hole will be etched. A via hole 38 is etched into the intermetal dielectric layer so that an electrical coupling between the aluminum layer 22 (metal 1) and the subsequently formed metal 2 can be made. In the present invention, the via hole 38 is etched into the intermetal dielectric layer by reactive ion etching with a fluorocarbon plasma. The fluorine atoms of the plasma and the intermetal dielectric chemically react to etch away the intermetal dielectric layer; the chemical reaction is assisted by ion bombardment. The reactive ion etching is continued until the second TiN layer 32 is completely removed and the underlying titanium layer 30 is revealed.

Although FIG. 5 shows a via hole with vertical side walls (vertical via), it is to be appreciated that the side walls in the dielectric layer may be "tapered" by processes well know in the art. Such tapering allows good metal step coverage for metal 2 but forms via holes with larger dimensions than the present technique.

Figure 1:
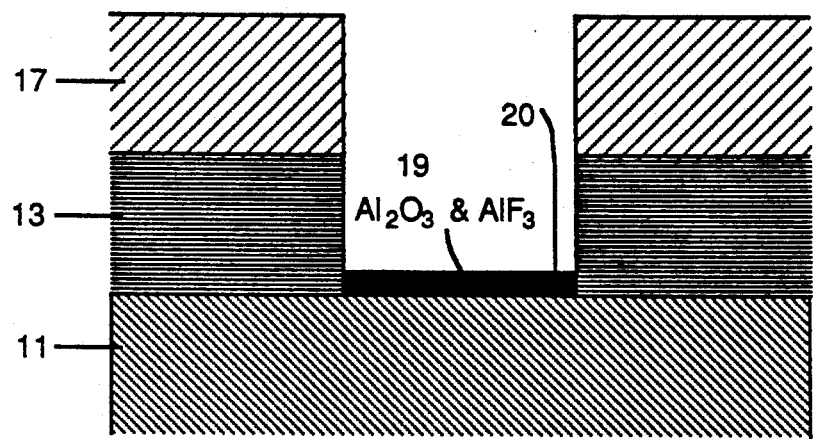
FIG. 1 is a cross-sectional view of a prior art fabrication of a via hole in an intermetal dielectric layer.

Referring back to the prior art method in FIG. 1, once the aluminum layer is reached and uncovered during the etching the exposed aluminum 20 readily reacts with fluorine to form $AlF_3$. When the semiconductor device is removed from the reaction chamber, the exposed aluminum layer 20 in the via hole readily reacts with oxygen to form $Al_2O_3$. Both $Al_2O_3$ and $AlF_3$ are insulating materials and materials which are difficult to remove. Applicant has tried a number of ways to remove the $Al_2O_3$ including buffered HF and sputter etching, none of which could remove the native oxide sufficiently enough. The presence of $Al_2O_3$ and $AlF_3$ 19 on the aluminum layer 11 in the bottom of the via hole as shown in FIG. 1, significantly increases the contact resistance between the aluminum layer (metal 1) and the subsequently formed metal layer (metal 2). The contact resistance of a via contact with $Al_2O_3$ and $AlF_3$ present is on the order of 10 ohms/via and can be as high as 100 ohms/via. Such an increase in contact resistance degrades the the fabricated integrated circuit's performance and reliability. The inconsistency in the resistance of the via contact is also an undesirable effect.

Referring to FIG. 5 of the present invention, when the etching of the via hole 38 in the intermetal dielectric layer 34 is complete, there has been no formation of $Al_2O_3$ or $AlF_3$ on the titanium layer in the bottom of the via hole 38. With the present invention, therefore, a low and consistent resistance contact on the order of 2 ohms/via can easily be formed.

Figure 6:
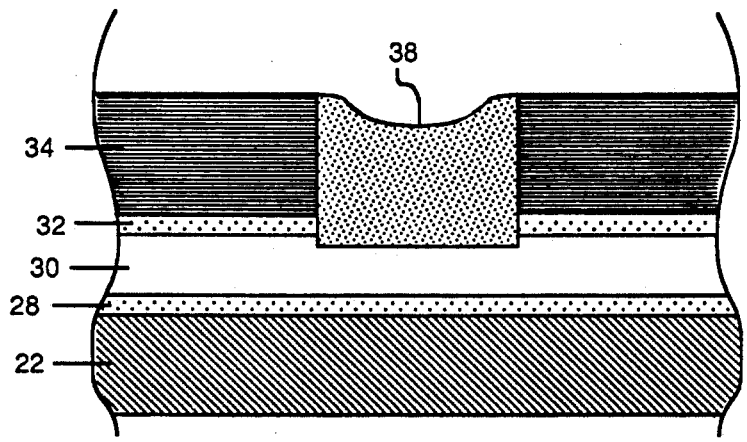
FIG. 6 is a cross-sectional view illustrating the formation of a tungsten plug in the via hole on the Ti layer on the tri-layer coating.

Next, referring to FIG. 6, the via hole 38 is filled with a tungsten plug. First, the photoresist layer 36 is stripped from the intermetal dielectric 34. Next a layer of CVD tungsten (W) is blanket deposited over the entire device. The via hole 38 eventually becomes completely filled with tungsten. The tungsten layer contacts the Ti layer of the tri-layer titanium coating in the via hole. Because tungsten adheres well to Ti, a strong and reliable contact to metal 1 is obtained. Since the blanket W film is deposited over the entire structure it is etched back so that it remains only in the vias using chlorine or fluorine based chemistry. When large vias are filled with tungsten plugs a slight dimple as shown in FIG. 6 may result.

Figure 7:
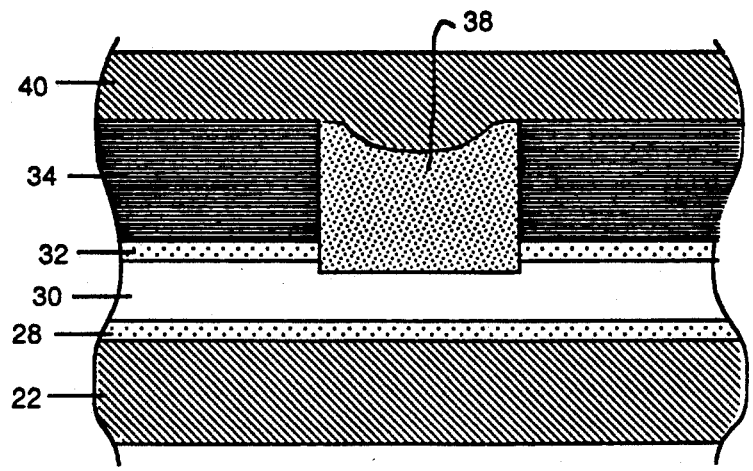
FIG. 7 is a cross-sectional view illustrating the formation of a second aluminum layer on the intermetal dielectric layer and on the tungsten plug.

Referring to FIG. 7, a second level metal layer (metal 2) is formed next. The aluminum layer 40 (metal 2) is sputtered to a thickness of approximately 8000 Å on the intermetal dielectric 34 and on the tungsten plug 38 filling in the via hole. The aluminum conducting layer 40 (metal 2) is effectively coupled at a low resistance through the tungsten plug 38 to the aluminum layer 22 (metal 1).

It is to be stressed that although this disclosure describes using the novel tri layer titanium coating on metal 1 when interlevel vias are used to couple metal 2 to metal 1, the described tri-layer coating and process are equally applicable in the formation of interconnection vias between metals 2 and 3 and between metals 3 and 4, and so on.

Thus, a novel tri-layer titanium coating for an aluminum layer has been described which prevents the formation of $Al_2O_3$ and $AlF_3$ during the fabrication of an interlevel via hole in an intermetal dielectric layer. The novel tri-layer titanium coating also provides an antireflective coating for the aluminum layer and prevents void formation in the aluminum layer.

I claim:

1. A tri-layer titanium coating for an aluminum layer of an interconnection comprising:
   a first TiN layer deposited on said aluminum layer;
   a Ti layer deposited on said first TiN layer; and
   a second TiN layer deposited on said Ti layer.

2. A tri-layer titanium coating for an aluminum layer used in interconnecting semiconductor devices of an integrated circuit comprising:
   a first TiN layer deposited on said aluminum layer, said first TiN layer thick enough to ensure no interaction between said aluminum layer and a subsequently formed Ti layer;
   a Ti layer deposited on said first TiN layer, said Ti layer thick enough to act as an etch stop; and
   a second TiN layer deposited on said Ti layer, said second TiN layer having a thickness optimized to minimize optical reflection during alignment.

3. A tri-layer titanium coating for an aluminum layer used in interconnecting semiconductor devices of an integrated circuit comprising:
   a first TiN layer of approximately 450 deposited on said aluminum layer;
   a Ti layer of approximately 1000 Å deposited on said first TiN layer; and
   a second TiN layer of approximately 450 Å deposited on said Ti layer.

* * * * *